(12) United States Patent
Xie et al.

(10) Patent No.: US 12,412,829 B2
(45) Date of Patent: Sep. 9, 2025

(54) METHOD AND STRUCTURE OF FORMING SIDEWALL CONTACT FOR STACKED FET

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Su Chen Fan, Cohoes, NY (US); Ravikumar Ramachandran, Pleasantville, NY (US); Oleg Gluschenkov, Tannersville, NY (US)

( * ) Notice: Subject to any disclaimer, the term of this patent is extended or adjusted under 35 U.S.C. 154(b) by 177 days.

(21) Appl. No.: 17/807,158

(22) Filed: Jun. 16, 2022

(65) Prior Publication Data

US 2023/0411397 A1    Dec. 21, 2023

(51) Int. Cl.
*H01L 27/12* (2006.01)
*H01L 21/285* (2006.01)
(Continued)

(52) U.S. Cl.
CPC .... *H01L 23/5226* (2013.01); *H01L 21/28518* (2013.01); *H01L 21/76877* (2013.01); *H10D 30/6737* (2025.01); *H10D 30/6743* (2025.01); *H10D 30/6757* (2025.01); *H10D 62/121* (2025.01); *H10D 84/013* (2025.01); *H10D 84/0133* (2025.01); *H10D 84/0149* (2025.01); *H10D 84/017* (2025.01); *H10D 84/038* (2025.01); *H10D 88/00* (2025.01);
(Continued)

(58) Field of Classification Search
CPC .......... H01L 23/5226; H01L 21/28518; H01L 21/8221; H01L 21/823418; H01L 21/823425; H01L 21/823475; H01L 21/823814; H01L 21/823871; H01L 27/0688; H01L 27/0847; H01L 27/458; H10D 88/00; H10D 88/01; H10D 84/013; H10D 84/0133; H10D 84/0149; H10D 84/017; H10D 84/0186; H10D 84/038; H10D 62/151; H10D 30/6737; H10D 30/6743
See application file for complete search history.

(56) References Cited

U.S. PATENT DOCUMENTS 8,466,451 B2   6/2013 Chang
9,431,388 B1   8/2016 Gauthier, Jr.
(Continued)

FOREIGN PATENT DOCUMENTS

| CN | 114512442 A | 5/2022 |
|---|---|---|
| EP | 4199059 A1 | 6/2023 |
| EP | 4199060 A1 | 6/2023 |

OTHER PUBLICATIONS

International Searching Authority, Written Opinion of the International Searching Authority, International application No. PCT/EP2023/064592, Dec. 21, 2023, all pages. (Year: 2023).*

(Continued)

*Primary Examiner* — Victoria K. Hall

(57) ABSTRACT

A microelectronic structure including a stacked transistor having a lower transistor and an upper transistor. A shared contact in contact with a lower source/drain of the first lower transistor and an upper source/drain of the upper transistor. The shared contact includes a silicide layer, a metal plug layer, and a conductive metal layer.

17 Claims, 5 Drawing Sheets

(51) Int. Cl.
    *H01L 21/768* (2006.01)
    *H01L 21/84* (2006.01)
    *H01L 23/522* (2006.01)
    *H10D 30/67* (2025.01)
    *H10D 62/10* (2025.01)
    *H10D 84/01* (2025.01)
    *H10D 84/03* (2025.01)
    *H10D 88/00* (2025.01)
    *H10D 62/13* (2025.01)

(52) U.S. Cl.
    CPC ......... *H10D 88/01* (2025.01); *H10D 30/6735* (2025.01); *H10D 62/151* (2025.01); *H10D 84/0186* (2025.01)

(56) References Cited

U.S. PATENT DOCUMENTS

| | | | |
|---|---|---|---|
| 9,472,558 | B1 | 10/2016 | Cheng |
| 9,659,963 | B2 | 5/2017 | Cheng |
| 9,711,501 | B1 * | 7/2017 | Basker ................. H01L 27/105 |
| 9,837,414 | B1 * | 12/2017 | Balakrishnan .... H01L 21/76895 |
| 10,192,867 | B1 | 1/2019 | Frougier |
| 10,707,304 | B2 | 7/2020 | Reznicek |
| 10,879,352 | B2 | 12/2020 | Zhang |
| 11,062,960 | B2 | 7/2021 | Wu |
| 2008/0199991 | A1 | 8/2008 | Kim |
| 2020/0126987 | A1 * | 4/2020 | Rubin ................. H10D 84/0186 |
| 2021/0217861 | A1 * | 7/2021 | Song .................... H10D 84/017 |
| 2022/0037528 | A1 * | 2/2022 | Chuang ............... H01L 27/0886 |
| 2022/0375328 | A1 | 11/2022 | Cohn |

OTHER PUBLICATIONS

International Searching Authority, International Search Report, International application No. PCT/EP2023/064592, Dec. 21, 2023, all pages. (Year: 2023).*

International Searching Authority, "Notification of Transmittal of The International Search Report and the Written Opinion of the International Searching Authority, Or the Declaration", Mailing Date Sep. 4, 2023, Application No. PCT/EP2023/064592, Filing Date May 31, 2023, 19 pgs.

* cited by examiner

METHOD AND STRUCTURE OF FORMING SIDEWALL CONTACT FOR STACKED FET

BACKGROUND

The present invention generally relates to the field of microelectronic, and more particularly to formation of contacts for the stacked FET devices.

Nanosheet is the lead device architecture in continuing CMOS scaling. However, nanosheet technology has shown issues when scaling down such that as the devices become smaller and closer together, they are interfering with each other. A way to achieve a higher devices density is by stacking the devices but forming the necessary connections to the stacked device can lead to structure errors, for example, shorts.

BRIEF SUMMARY

Additional aspects and/or advantages will be set forth in part in the description which follows and, in part, will be apparent from the description, or may be learned by practice of the invention.

A microelectronic structure including a stacked transistor having a lower transistor and an upper transistor. A shared contact in contact with a lower source/drain of the first lower transistor and an upper source/drain of the upper transistor. The shared contact includes a silicide layer, a metal plug layer, and a conductive metal layer.

In accordance with an aspect of the present invention where the silicide layer is in direct contact with the lower source/drain.

In accordance with an aspect of the present invention where the metal plug layer is located on top of the silicide layer and the conductive metal layer is located on top of the metal plug layer.

In accordance with an aspect of the present invention where the microelectronic structure includes a thickening layer located on the sidewalls of the upper source/drain. An upper silicide layer located on the sidewalls of the thickening layer, where the thickening layer is located between upper silicide and the upper source/drain.

In accordance with an aspect of the present invention where a sidewall of the conductive metal layer of the shared contact is in direct contact with the upper silicide layer.

In accordance with an aspect of the present invention where the microelectronic structure includes an isolation layer is located between the lower source/drain and the upper source/drain.

In accordance with an aspect of the present invention where a sidewall of the metal plug layer of the shared contact is in direct contact with the isolation layer.

A microelectronic structure including a first stacked transistor having a first lower transistor and a first upper transistor. A shared contact in contact with a first lower source/drain of the first lower transistor and a first upper source/drain of the first upper transistor. The shared contact includes a silicide layer, a metal plug layer, and a conductive metal layer. A second stacked transistor having a second lower transistor and a second upper transistor located adjacent to the first stacked transistor.

In accordance with an aspect of the present invention where the silicide layer is in direct contact with the lower source/drain.

In accordance with an aspect of the present invention where the metal plug layer is located on top of the silicide layer and the conductive metal layer is located on top of the metal plug layer.

In accordance with an aspect of the present invention where the microelectronic structure includes a thickening layer located on the sidewalls of the upper source/drain. An upper silicide layer located on the sidewalls of the thickening layer, where the thickening layer is located between upper silicide and the upper source/drain.

In accordance with an aspect of the present invention where a sidewall of the conductive metal layer of the shared contact is in direct contact with the upper silicide layer.

In accordance with an aspect of the present invention where the microelectronic structure includes an isolation layer is located between the lower source/drain and the upper source/drain.

In accordance with an aspect of the present invention where wherein a sidewall of the metal plug layer of the shared contact is in direct contact with the isolation layer.

In accordance with an aspect of the present invention where the microelectronic structure includes a lower contact in contact with a second lower source/drain of the second lower transistor, where the lower contact includes a second silicide layer, a second metal plug layer, and a second conductive metal layer.

In accordance with an aspect of the present invention where the second silicide layer is in direct contact with the second lower source/drain, wherein the second metal plug layer is located on top of the second silicide layer and the second conductive metal layer is located on top of the second metal plug layer.

In accordance with an aspect of the present invention where the microelectronic structure includes a top contact in contact with a second upper source/drain of the second upper transistor, where the second upper source/drain has a cup shape.

In accordance with an aspect of the present invention where the microelectronic structure includes a thickening layer located on the sidewalls of the upper source/drain. An upper silicide layer located on the sidewalls of the thickening layer, where the thickening layer is located between upper silicide and the upper source/drain, and where the upper silicide layer is direct contact with a bottom surface and sidewall of the top contact.

A method including the steps of forming a stacked transistor having a lower transistor and an upper transistor. Forming a shared contact in contact with a lower source/drain of the first lower transistor and an upper source/drain of the upper transistor. The shared contact includes a silicide layer, a metal plug layer, and a conductive metal layer. The silicide layer, the metal plug layer and the conductive metal layer are separately formed.

In accordance with an aspect of the present invention where the microelectronic structure includes forming a thickening layer on the sidewalls of the upper source/drain of upper transistor, where the thickening layer is formed prior to the formation of the conductive metal layer of the shared contact.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 2:
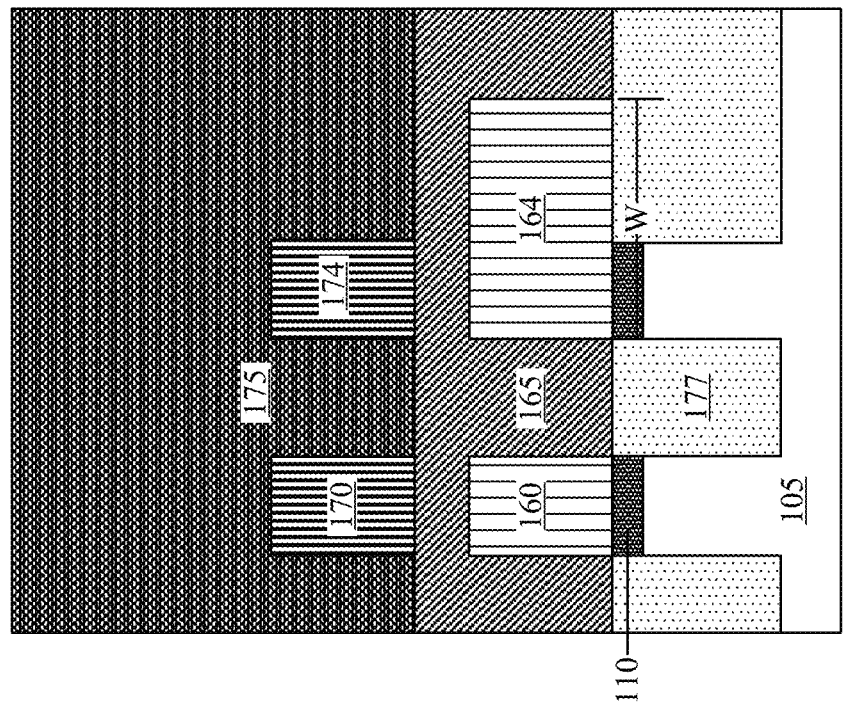
FIG. 2 illustrates a cross section Y of the source/drain region, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art e affect art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. A way to increase the density of devices is by stacking the devices vertically on top of each other. Contacts need to be formed for the lower device, where the contacts usually pass through the upper device. A portion of a component in the upper device, for example, an upper source/drain, is removed to allow for the contact formation but the amount of remaining material does not allow for a good connection between the contact and the upper component. The present invention is directed to addressing this issue by epitaxially growing a thickening layer on the upper source/drain after the formation of the trench for the contact. The additional epi material allows for a silicide to be formed between the upper source/drain and the contact.

Figure 1:
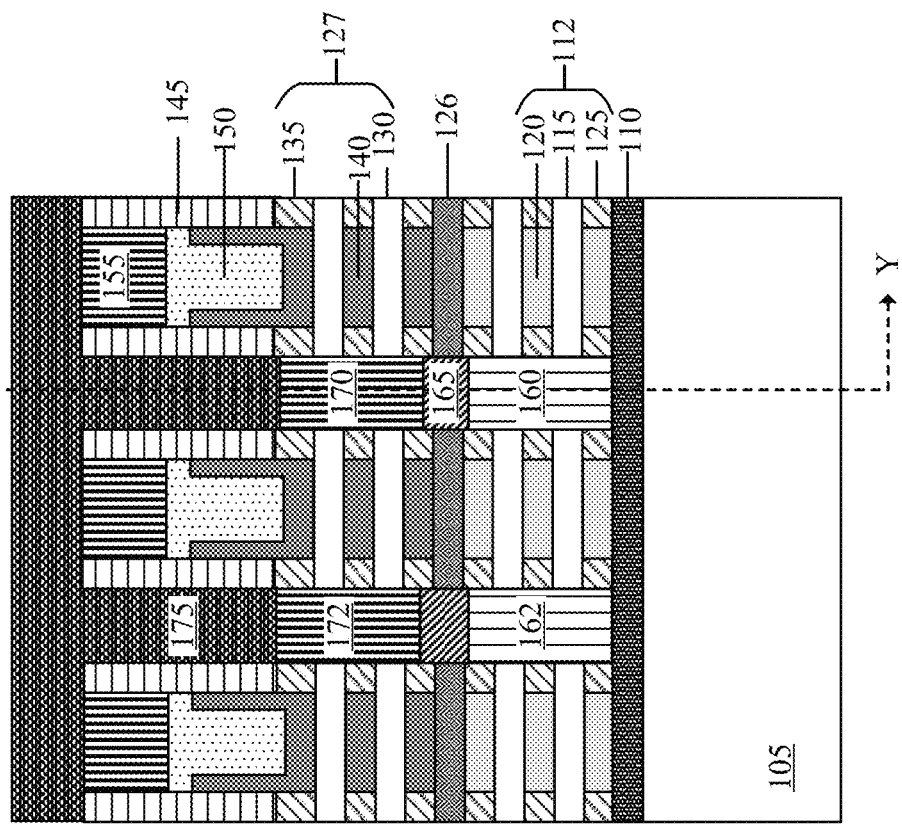
FIG. 1 illustrates a cross section of a plurality of stack devices through a gate region, in accordance with the embodiment of the present invention.

FIG. 1 illustrates a cross section of a plurality of stack devices through a gate region, in accordance with the embodiment of the present invention. The gate region includes a plurality of stacked devices or stacked transistors, a first and second lower source/drain 160, 162, an isolation layer 165, a first and second upper source/drain 170, 172, and an interlayer dielectric layer 175. The plurality of stacked devices is located on top of a bottom dielectric layer 110 and a substrate 105.

The substrate 105 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 may be doped, undoped or contain doped regions and undoped regions therein.

Each of the plurality of stacked devices is comprised of a lower device 112 and an upper device 127. The upper device 127 and the lower device 112 are separated by a dielectric layer 126. The lower device 112 includes a plurality of channel layers 115 (e.g., nanosheets), a lower gate 120, and a lower inner spacer 125. The upper device 127 includes a plurality of channel layers 130 (e.g., nanosheets), an upper gate 140, and an upper inner spacer 135. A metal fill 150 is located between sections of the upper gate 140. The metal fill 150 can be comprised of, for example, W. A gate cap 155 is located on top of the metal fill 150. An upper spacer 145 is located on top of the upper inner spacer 135 and adjacent to portions of the upper gate 140, the metal fill 150, and the gate cap 155. The lower gate 120 can be comprised of, for example, a gate dielectric liner, such as high-k dielectric like $HfO_2$, $ZrO_2$, $HfL_aOx$, etc., and work function layers, such as TiN, TiAlC, TiC, etc. The upper gate 140 can be comprised of, for example, a gate dielectric liner, such as high-k dielectric like $HfO_2$, $ZrO_2$, $HfL_aOx$, etc., and work function layers, such as TiN, TiAlC, TiC, etc. The lower gate 120 can be the same or different material as the upper gate 140.

The first and second lower source/drain 160, 162 and the first and second upper source/drain 170, 172 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

The interlayer dielectric layer 175 is located on top of the upper spacer 145 and the gate cap 155. A portion of the interlayer dielectric layer 175 is located between each of the plurality of stacked devices, such that, the interlayer dielectric layer 175 is in contact with a top surface of the first and second upper source/drain 170, 172 and in contact with the sidewalls of the upper spacer 145.

FIG. 2 illustrates a cross section Y of the source/drain region, in accordance with the embodiment of the present invention. Cross section Y is located through the first lower source/drain 160 and the first upper source/drain 170. The source/drain region as illustrated by FIG. 2, illustrates the first lower source/drain 160, a third lower source/drain 164, the first upper source/drain 170, and a third upper source/drain 174. The first lower source/drain 160 and the third lower source/drain 164 are located on top of the bottom dielectric layer 110. During the processing steps prior to the formation of the lower source/drains 160, 162, 164, trenches (not shown) are formed in the substrate 105 because of an etching process. The trenches are filled in with a shallow trench isolation layer 177. The first lower source/drain 160 has a first width in the source/drain region and the third lower source/drain 164 has a second width in the source/drain region, where the second width is larger than the first width. The third lower source/drain 164 extends horizontally along the top surface of the shallow trench isolation layer 177, such that, a bottom surface of the third lower source/drain 164 is in contact with the bottom dielectric layer 110 and the shallow trench isolation layer 177. The third upper source/drain 174 is located above a portion of the third lower source/drain 164, such that, the third upper source/drain 174 is vertically aligned with the bottom dielectric layer 110 located beneath the third lower source/drain 164. The width W of the third lower source/drain 164 allows for a portion of the third lower source/drain 164 not being located beneath the third upper source/drain 174. This creates space for a contact to reach the third lower source/drain 164 without interfering with the third upper source/drain 174. The isolation layer 165 is located all around the first lower source/drain 160 and the third lower source/drain 164. The isolation layer 165 is located on top of the shallow trench isolation layer 177. The first upper source/drain 170 and the third upper source/drain 174 are located on top of the isolation layer 165. The interlayer dielectric layer 175 is located all around the first upper source/drain 170 and the third upper source/drain 174. The interlayer dielectric layer 175 is located on top of the isolation layer 165.

Figure 3:
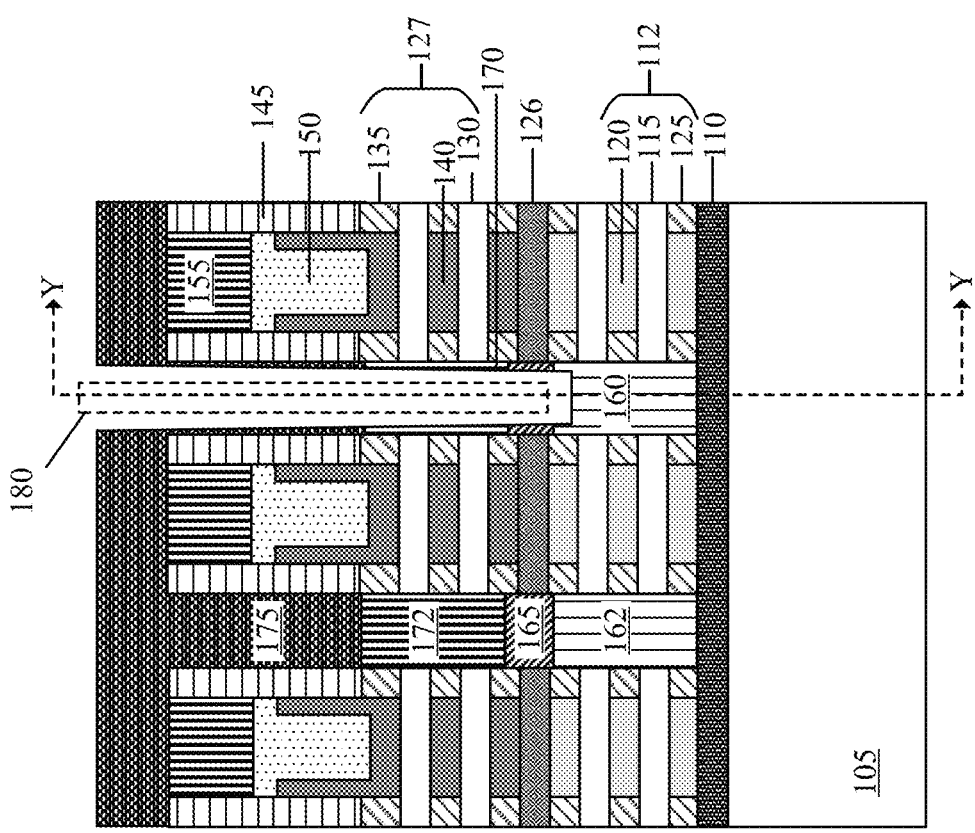
FIG. 3 illustrates a cross section of a plurality of stack devices through a gate region after the formation of a shared contact trench, in accordance with the embodiment of the present invention.

FIG. 3 illustrates a cross section of a plurality of stack devices through a gate region after the formation of a shared contact trench 180, in accordance with the embodiment of the present invention. A shared contact trench 180 is formed by removing a portion of the interlayer dielectric layer 175, the first upper source/drain 170, and the isolation layer 165. A portion of the first lower source/drain 160 could also be removed. A small portion of the first upper source/drain 170 remains after creation of the shared contact trench 180. The shared contact trench 180 hollows out the center of the upper source/drain 170. The small portion of the first upper source/drain 170 forms a portion of the sidewalls of the shared contact trench 180. However, the amount of the first upper source/drain 170 remaining could lead to errors or defects in the final product, since the amount of material of the upper source/drain 170 remaining is not enough to form a good connection with the shared contact.

Figure 4:
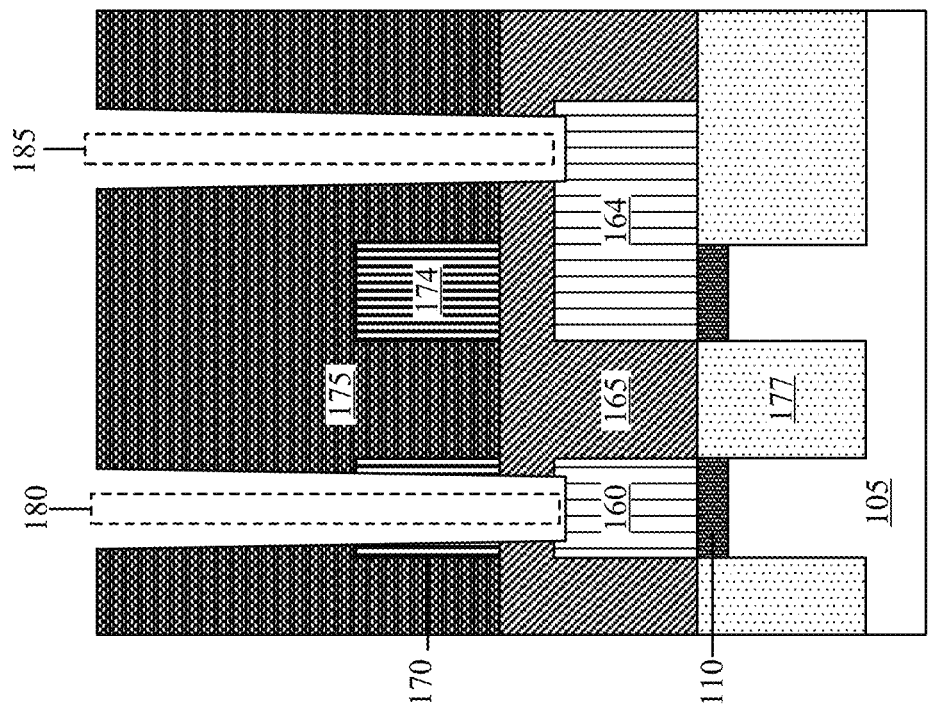
FIG. 4 illustrates a cross section Y of the source/drain region after the formation of a shared contact trench and an independent lower contact trench, in accordance with the embodiment of the present invention.

FIG. 4 illustrates a cross section Y of the source/drain region after the formation of a shared contact trench 180 and an independent lower contact trench 185, in accordance with the embodiment of the present invention. The shared contact trench 180 extends through the interlayer dielectric layer 175, the first upper source/drain 170, and the isolation layer 165 to reach the first lower source/drain 160. An independent lower contact trench 185 is formed in the interlayer dielectric layer 175 and the isolation layer 165 to reach the third lower source/drain 164. The third lower source/drain 164 is wider than the third upper source/drain 174 to provide enough space for the formation of the independent lower contact trench 185. The independent lower contact trench 185 is spaced apart from the third upper source/drain 174 to ensure that the contact does not create a short.

Figure 5:
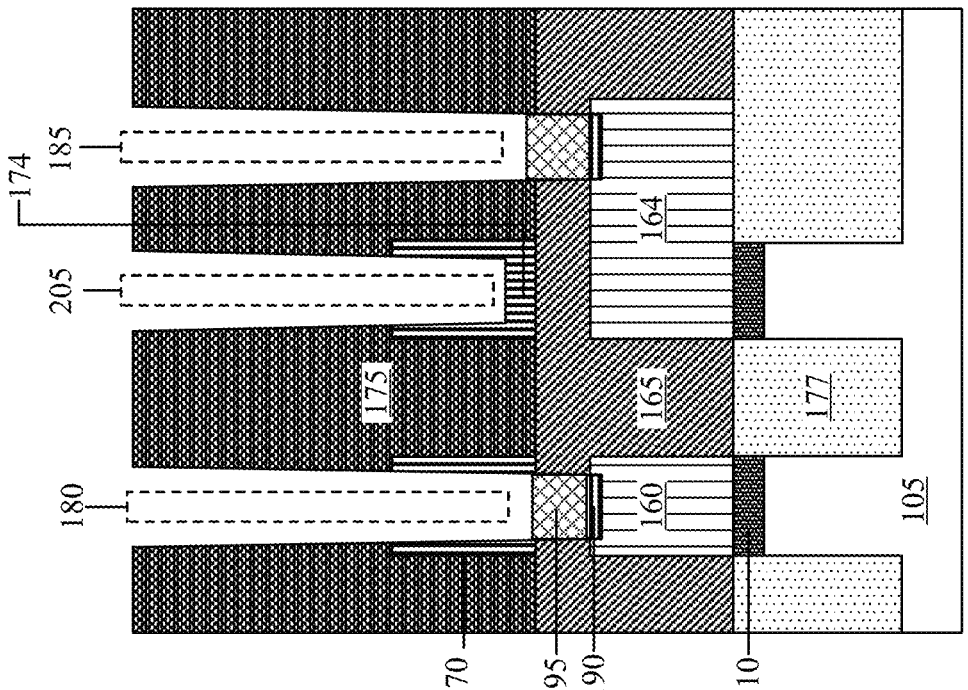
FIG. 5 illustrates a cross section of a plurality of stack devices through a gate region after the formation of a silicide layer, a metal plug and top contact trenches, in accordance with the embodiment of the present invention.
Figure 6:
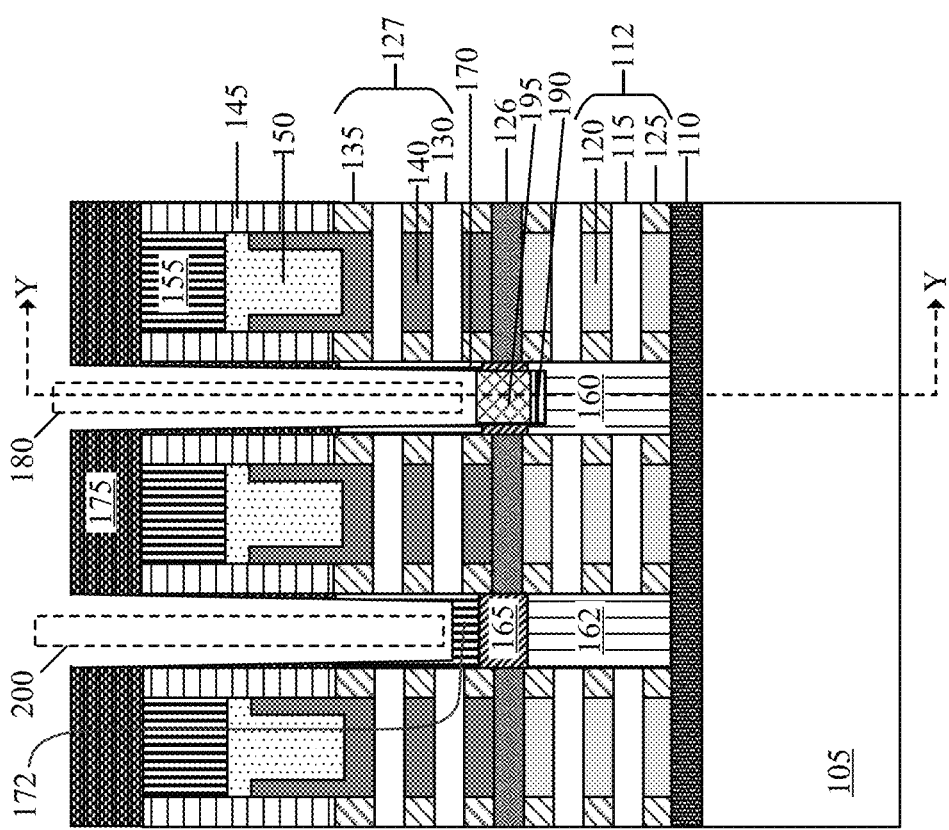
FIG. 6 illustrates a cross section Y of the source/drain region after the formation of a silicide layer, a metal plug, and top contact trenches, in accordance with the embodiment of the present invention.

FIG. 5 illustrates a cross section of a plurality of stack devices through a gate region after the formation of a silicide layer 190, a metal plug 195 and top contact trenches 200, 205, in accordance with the embodiment of the present invention. FIG. 6 illustrates a cross section Y of the source/drain region after the formation of a silicide layer 190, a metal plug 195 and top contact trenches 200, 205, in accordance with the embodiment of the present invention. A silicide layer 190 can be formed by, for example, radio frequency phase vapor deposition (RFPVD) in the bottom of the shared contact trench 180 and the independent lower contact trench 185. A metal plug 195 is formed on top of the silicide layer 190, by either bottom-up selective metal growth, or overfilling the contact openings with metal followed by metal recess. After the formation of the metal plug 195 then a first top contact trench 200 and a second top contact trench 205 are formed by lithography and etching processes. The first and second top contact trench 200, 205 extend through the interlayer dielectric layer 175 and in to but not through the second and third upper source/drain 172, respectively. A portion of the second upper source/drain 172 and a portion of the third upper source/drain 174 are removed during the created of the first and second top contact trench 200, 205. After the removal of the source/drain material, the second upper source/drain 172 and the third upper source/drain 174 have a cup shape, i.e., a hollow center, thin sidewalls, and a thicker base. The amount of the material remaining of the second and third upper source/drain 172, 174 is not thick enough to allow for the formation of a silicide.

Figure 7:
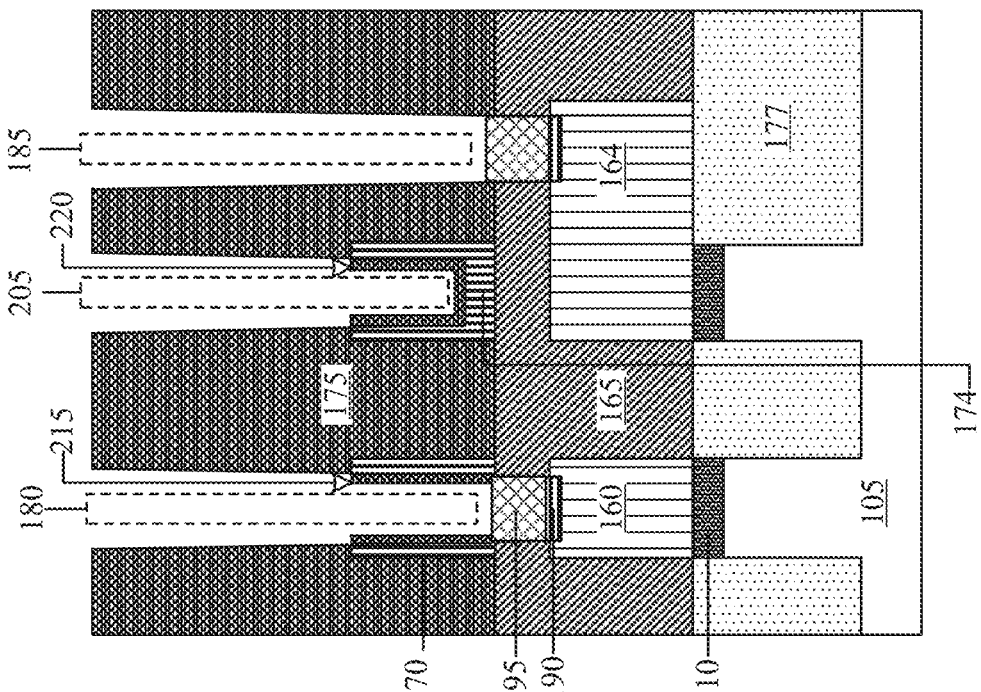
FIG. 7 illustrates a cross section of a plurality of stack devices through a gate region after the formation of a thickening layer, in accordance with the embodiment of the present invention.
Figure 8:
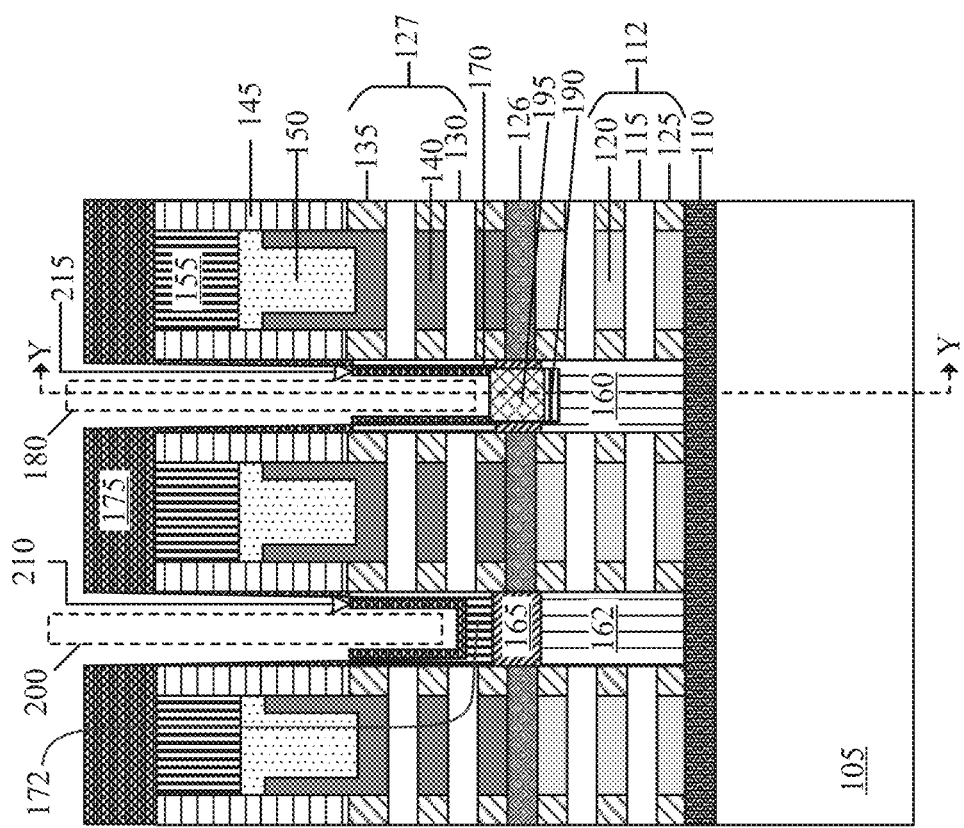
FIG. 8 illustrates a cross section Y of the source/drain region after the formation of a thickening layer, in accordance with the embodiment of the present invention.

FIG. 7 illustrates a cross section of a plurality of stack devices through a gate region after the formation of a thickening layer 210, 215, 220, in accordance with the embodiment of the present invention. FIG. 8 illustrates a cross section Y of the source/drain region after the formation of a thickening layer 210, 215, 220, in accordance with the embodiment of the present invention. The thickening layer 210, 215, 220, is epitaxially grown at a lower temperature on the exposed surfaces of the first, second, and third upper source/drain 170, 172, 174, respectively. The thickening layer 210, 215, 220, can be comprised of, for example, boron doped SiGe for PFET, where the percentage of Ge is in the range for about 50% to 80%, more preferably around 60%, or P-doped Si for NFET The thickening layer 210, 215, 220 is able to be selectively grown at low temperatures, i.e., a temperature that will not damage any of the other components of the device. The thickening layer 210, 215, 220 adds material to the first, second, and third upper source/drain 170, 172, 174, respectively, that was removed during the formation of the top upper contact trenches 200, 205 and the shared contact trench 180.

Figure 9:
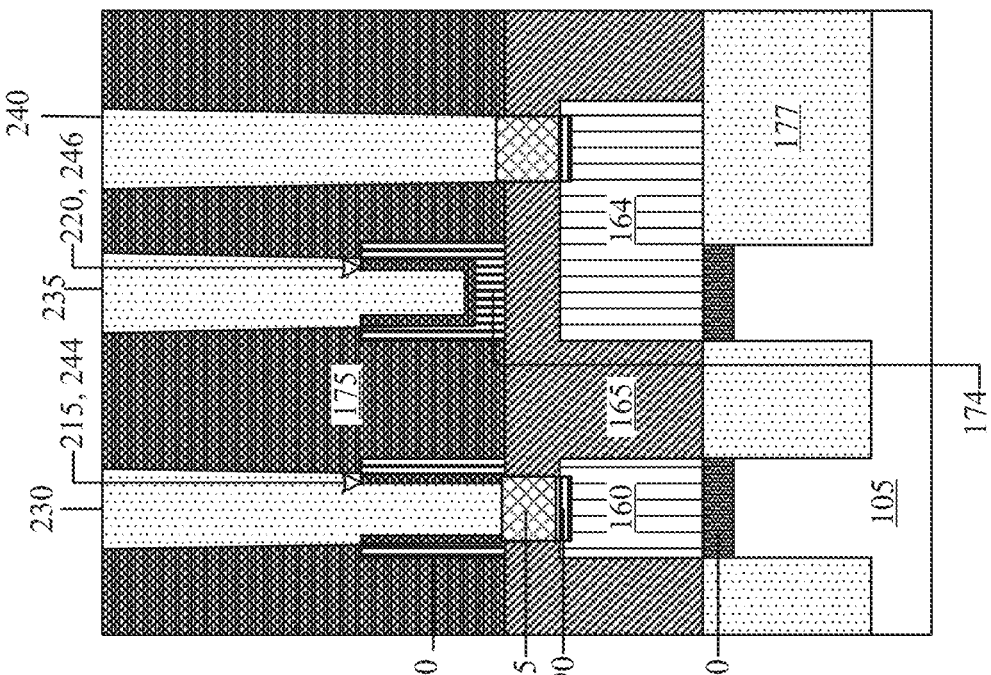
FIG. 9 illustrates a cross section of a plurality of stack devices through a gate region after the formation of a contact, in accordance with the embodiment of the present invention.
Figure 10:
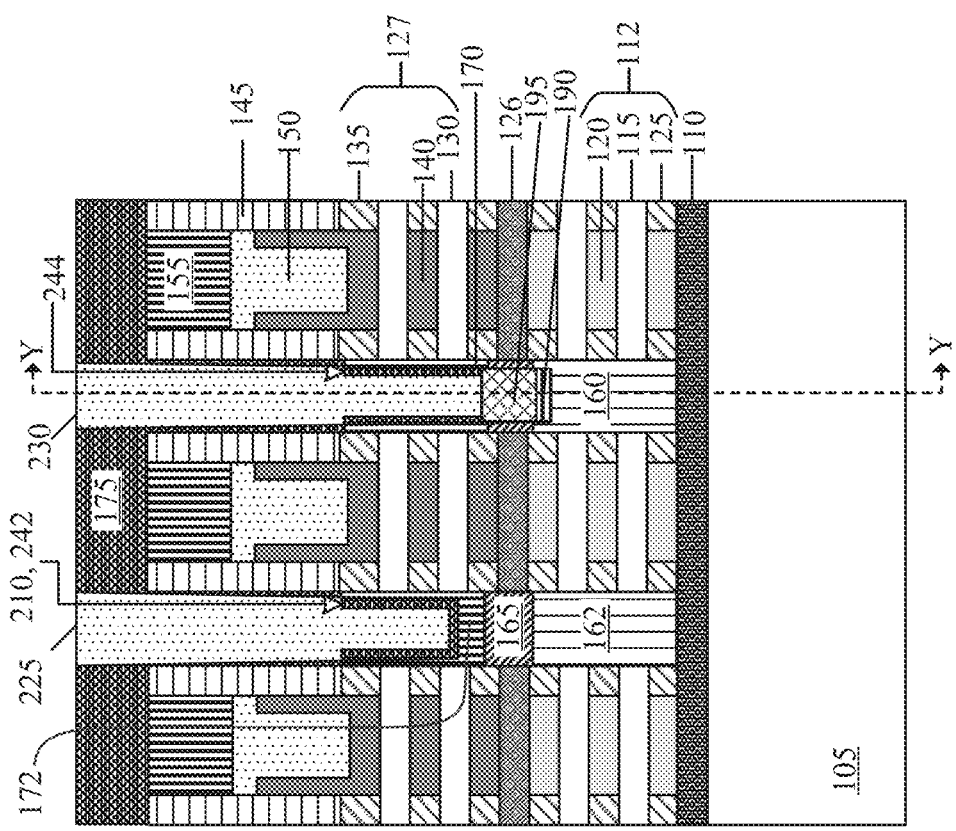
FIG. 10 illustrates a cross section Y of the source/drain region after the formation of a contact, in accordance with the embodiment of the present invention.

FIG. 9 illustrates a cross section of a plurality of stack devices through a gate region after the formation of contacts 225, 230, 235, 240, in accordance with the embodiment of the present invention. FIG. 10 illustrates a cross section Y of the source/drain region after the formation of contacts 225, 230, 235, 240, in accordance with the embodiment of the present invention. The shared contact trench 180, the lower contact trench 185, and the first and second top contact trenches 200, 205 are filled with a conductive metal to form a top portion of the shared contact 230, a top portion of the lower contact 240, a first top contact 225, and a second top contact 235. The thickening layers 210, 215, 220, allows for the formation an upper silicide layers 242, 244, and 246 during the formation of the contacts. The upper silicide layers 242, 244, 246 is a relatively thin layer that is formed on the thickening layer 210, 215, 220, respectively. This means that portions of the thickening layers 210, 215, and 220 will remain after the formation of the silicide 242, 244, 246, respectively. Therefore, the thickening layer 215 is located between the first upper source/drain 170 and the first upper silicide layer 244. The thickening layers 210, and 220 are located between the second/third upper source/drain 172, 174 and the second/third upper silicide layers 242, 246, respectively. FIG. 10 illustrates the combined thickening layer 210, 215, 220, and the upper silicide layers 242, 244, 246 and not as individual layer. It is well understood that the FIG. 10 is for illustrative purposes only and that the thickening layers 210, 215, 220, and the upper silicide layers 242, 244, 246 are separate layers. Therefore, the silicide layers 242 and 246 has a cup shape allowing for silicide to be in contact with three sides of the first and second top contact 225, 235, respectively. The silicide layer 244 is in contact with the sidewalls of the top portion shared contact 230, while the bottom surface of the shared contact 230 is in contact with the metal plug 195. The top portion of the lower contact 240 is not in contact with a thickening layer since a thickening layer was not formed in the lower contact trench 185. The combined shared contact is composed of the silicide layer 190, the metal plug 195, and the top shared portion of the shared contact 230. The combined lower contact includes the silicide layer 190, the metal plug 195, and the top portion of the lower contact 240.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiments, the practical application or technical improvement over technologies found in the marketplace, or to enable others of ordinary skill in the art to understand the embodiments disclosed herein.

What is claimed is:

1. A microelectronic structure comprising:
    a first stacked transistor having a first lower transistor and a first upper transistor, wherein the first lower transistor includes a plurality of nanosheets, wherein the first upper transistor includes a plurality of nanosheets, wherein a dielectric layer separates the first lower transistor and the first upper transistor;
    a shared contact in contact with a first lower source/drain of the first lower transistor and a first upper source/drain of the upper transistor, wherein the shared contact includes an upper silicide layer, a metal plug layer, a thickening layer, and a conductive metal layer, wherein a top surface of the metal plug is in contact with the thickening layer, wherein a bottom surface of the metal plug is in contact with a bottom silicide layer;
    a second stacked transistor having a second lower transistor and a second upper transistor, the second stacked transistor located adjacent to the first stacked transistor, wherein a second upper source/drain has a cup shape, wherein a cup thickening layer is in contact with the second upper source/drain, and a cup silicide layer is in contact with the cup thickening layer; and
    a top contact in contact with the cup silicide layer, wherein the cup silicide layer and the cup thickening layer are located between the top contact and the second upper source/drain.

2. The microelectronic structure of claim 1, wherein the bottom silicide layer is in direct contact with the first lower source/drain.

3. The microelectronic structure of claim 2, wherein the metal plug layer is located on top of the bottom silicide layer and the conductive metal layer is located on top of the metal plug layer.

4. The microelectronic structure of claim 1, wherein the thickening layer is located on at least one sidewall of the first upper source/drain; and
    wherein the upper silicide layer is located on at least one sidewall of the thickening layer, wherein the thickening layer is located between the upper silicide and the first upper source/drain.

5. The microelectronic structure of claim 4, wherein a sidewall of the conductive metal layer of the shared contact is in direct contact with the upper silicide layer.

6. The microelectronic structure of claim 1, further comprising:
    an isolation layer is located between the first lower source/drain and the first upper source/drain.

7. The microelectronic structure of claim 6, wherein a sidewall of the metal plug layer of the shared contact is in direct contact with the isolation layer.

8. A microelectronic structure comprising:
    a first stacked transistor having a first lower transistor and a first upper transistor, wherein the first lower transistor includes a plurality of nanosheets, wherein the first upper transistor includes a plurality of nanosheets, wherein a dielectric layer separates the first lower transistor and the first upper transistor;
    a shared contact in contact with a first lower source/drain of the first lower transistor and a first upper source/drain of the first upper transistor, wherein the shared contact includes an upper silicide layer, a metal plug layer, a thickening layer, and a conductive metal layer, wherein a top surface of the metal plug is in contact with the thickening layer, wherein a bottom surface of the metal plug is in contact with a bottom silicide layer;
a second stacked transistor having a second lower transistor and a second upper transistor, the second stacked transistor located adjacent to the first stacked transistor; and
a lower contact in contact with a second lower source/drain of the second lower transistor, wherein the lower contact includes a second silicide layer, a second metal plug layer, and a second conductive metal layer, wherein a vertical side surface of the second conductive metal layer is in contact with an upper dielectric layer.

9. The microelectronic structure of claim 8, wherein the bottom silicide layer is in direct contact with the first lower source/drain.

10. The microelectronic structure of claim 9, wherein the metal plug layer is located on top of the bottom silicide layer and the conductive metal layer is located on top of the metal plug layer.

11. The microelectronic structure of claim 8,
wherein the thickening layer is located on at least one sidewall of the first upper source/drain; and
wherein the upper silicide layer is located on at least one sidewall of the thickening layer, wherein the thickening layer is located between the upper silicide layer and the upper source/drain.

12. The microelectronic structure of claim 11, wherein a sidewall of the conductive metal layer of the shared contact is in direct contact with the upper silicide layer.

13. The microelectronic structure of claim 8, further comprising:
an isolation layer is located between the first lower source/drain and the first upper source/drain.

14. The microelectronic structure of claim 13, wherein a sidewall of the metal plug layer of the shared contact is in direct contact with the isolation layer.

15. The microelectronic structure of claim 8, wherein the second silicide layer is in direct contact with the second lower source/drain, wherein the second metal plug layer is located on top of the second silicide layer and the second conductive metal layer is located on top of the second metal plug layer.

16. The microelectronic structure of claim 8, further comprising:
a top contact in contact with a second upper source/drain of the second upper transistor, wherein the second upper source/drain has a cup shape.

17. The microelectronic structure of claim 16, further comprising:
a second thickening layer located on the sidewalls of the second upper source/drain; and
a second upper silicide layer located on the sidewalls of the second thickening layer, wherein the second thickening layer is located between the second upper silicide layer and the second upper source/drain, wherein the second upper silicide layer is in direct contact with a bottom surface and sidewall of the top contact.

* * * * *